United States Patent
Cho

(10) Patent No.: US 6,627,502 B1
(45) Date of Patent: Sep. 30, 2003

(54) METHOD FOR FORMING HIGH CONCENTRATION SHALLOW JUNCTIONS FOR SHORT CHANNEL MOSFETS

(75) Inventor: Shiu-Ying Cho, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/279,898

(22) Filed: Oct. 24, 2002

(51) Int. Cl.⁷ .................... H01L 21/336; H01L 21/8238
(52) U.S. Cl. .................... 438/265; 438/199; 438/231; 438/305
(58) Field of Search ................ 438/265, 199, 438/231, 305, 202–205, 234, 236, 304–309, 326, 332

(56) References Cited

U.S. PATENT DOCUMENTS

| | | | | |
|---|---|---|---|---|
| 5,572,062 A | * | 11/1996 | Iranmanesh | 257/530 |
| 5,700,712 A | * | 12/1997 | Schwalke | 438/430 |
| 5,710,054 A | | 1/1998 | Gardner et al. | 437/44 |
| 5,759,885 A | | 6/1998 | Son | 438/230 |
| 5,930,617 A | | 7/1999 | Wu | 438/233 |
| 6,136,636 A | | 10/2000 | Wu | 438/231 |
| 6,218,716 B1 | * | 4/2001 | Wang et al. | 257/413 |
| 6,358,827 B1 | | 3/2002 | Chen et al. | 438/585 |
| 6,380,039 B2 | * | 4/2002 | Badenes et al. | 438/301 |
| 6,465,312 B1 | * | 10/2002 | Yu | 438/300 |
| 6,479,350 B1 | * | 11/2002 | Ling et al. | 438/265 |

OTHER PUBLICATIONS

Wu et al, "Supression of Boron Penetration into an Ultra–Thin Gate Oxide by Using a Stacked–Amorphous–Silicon (SAS) Film", 1993 IEEE, IEDM 93–329, pp. 13.3.1–13.3.4.*

Wu et al, "Characteristics of Polysilicon Contacted Shallow Junction Diode Formed with a Stacked–Amorphous–Silicon Film", IEEE Transaction on Electronic Devices, vol. 40, No. 10, Oct. 1993, pp. 1797–1804.*

* cited by examiner

*Primary Examiner*—Michael S. Lebentritt
(74) *Attorney, Agent, or Firm*—George O. Saile; Stephen B. Ackerman

(57) ABSTRACT

A method is taught for forming shallow LDD diffusions using polysilicon sidewalls as a diffusion source. The polysilicon sidewalls are formed along side squared-off silicon nitride sidewall spacers which have an essentially rectangular cross section and are in direct contact with the subjacent silicon wherein the shallow LDD elements are formed. The method is applied to the formation of a p-channel MOSFET with salicide contacts wherein the polysilicon sidewalls can be made full size because the essentially flat tops of the nearly rectangular silicon nitride sidewalls provide ample gate-to-source drain spacing to prevent silicide bridging and thereby reduce gate-to-source/drain shorts. In addition, the squared-off silicon nitride sidewalls are formed with parallel vertical sides. This permits improved control of their width, reduced lateral encroachment of boron dopant under the gate, and reduced gate-to-source drain silicide bridging. The reduced boron encroachment results in reduced source/drain series resistance as well as inhibition of short channel effects in the p-channel MOSFET. The full sized polysilicon sidewall also permits greater silicide contact area which fosters results in better contact to the LDD elements and overall lower contact resistance. The source/drain contacts are made not only to the single crystalline silicon of the main source/drain regions, as in conventional contacts, but also directly to the LDD region through the large area silicide region over the polysilicon sidewall. The process is applied to the formation of a CMOS structure having shallow, high concentration, p-type LDD elements on the p-channel device.

20 Claims, 14 Drawing Sheets

METHOD FOR FORMING HIGH CONCENTRATION SHALLOW JUNCTIONS FOR SHORT CHANNEL MOSFETS

BACKGROUND OF THE INVENTION (1) Field of the Invention

The invention relates to processes for the manufacture of semiconductor devices and more particularly to processes for forming self-aligned polysilicon gate field effect transistors.

(2) Background to the Invention and Description of Related Art

Complimentary metal oxide semiconductor(CMOS) field effect transistor(FET) technology involves the formation n-channel FETs(NMOS) and p-channel FETs(PMOS) in combination to form low current, high performance integrated circuits. The complimentary use of NMOS and PMOS devices, typically in the form of a basic inverter device, allows a considerable increase of circuit density of circuit elements by reduction of heat generation. The increase in device density accompanied by the shrinkage of device size has resulted in improved circuit performance and reliability as well as reduced cost. For these reasons CMOS integrated circuits have found widespread use, particularly in digital applications.

The basic MOSFET (Metal Oxide Semiconductor Field Effect Transistor), whether it be an NMOS or PMOS is typically formed by a self-aligned polysilicon gate process wherein source and drain regions are formed adjacent to the polysilicon gate by ion implantation using the gate as a mask. The source/drain is thereby self-aligned to the gate electrode. A channel region directly under the polysilicon gate is thereby also defined by the gate electrode. In order to reduce hot electron injection into the channel region, a low concentration of source/drain dopant is first implanted with the gate as a mask. This is commonly referred to as a lightly doped drain (LDD) implant. Sidewalls are then formed alongside the gate electrode and a second substantially higher dosage implant is then applied to form the main source/drain regions which are spaced laterally away from the edge of the polysilicon gate by the sidewall thickness. The completed source/drain regions then each consist of a main heavily doped portion to which external contact is made and a lightly doped (LDD) portion next to the channel region.

As device dimension continue to shrink, short channel effects become significant and begin to affect device performance. In conventional LDD processes short channel effects are compensated by implanting shallower junctions which come at the expense of high impurity concentrations. As a consequence, the resultant lower impurity concentrations cause undesirably high source and drain series resistance. It would be beneficial to be able to form shallow LDD regions with high impurity concentration. The process of the present invention, which introduces LDD dopant from a silicon spacer, overcomes these shortcomings which are characteristic of ion implanted LDD regions.

Diffusion of dopants into active regions, in particular LDD regions, using a polysilicon spacer as a dopant source is not new. However the method of the present invention overcomes some of the shortcomings of the prior methods. Wu, U.S. Pat. No. 6,136,636 discloses a method for simultaneously forming source/drain and LDD regions by ion implanting dopant ions into a substrate where the LDD regions are covered by an amorphous silicon layer on a pad oxide. The source/drain regions are uncovered and therefore receive a greater dose than the covered LDD regions. The amorphous silicon layer is then oxidized and the dopant implanted therein is driven into the substrate through the subjacent pad oxide. The pad oxide also forms a sidewall on the polysilicon gate. Thus the pad oxide sidewall determines the final spacing of the LDD edge with respect to the edge of the gate electrode. There are several disadvantages of this technique. One disadvantage is that the final spacing of the LDD edge and the LDD diffusion are both dependent upon the pad oxide thickness and thereby also upon each other. Although shallow LDD regions may be formed by this method, the dopant concentration and profile is nevertheless determined by the non-uniform implanted dopant profile which is further dispersed after transit through the pad oxide resulting in a weakened or less abrupt dopant profile. In addition, the segregation coefficients of the dopants between oxide and silicon are different for—and p-type dopants.

In a related patent, Wu, U.S. Pat. No. 5,930,617 diffuses nitrogen from an amorphous silicon layer (not a sidewall) through an intermediate pad oxide to form shallow LDD regions. The diffusion takes place concurrently with the oxidation of the amorphous layer. While slightly different than Wu '636, the method suffers from the same disadvantages cited above.

Gardner, et.al., U.S. Pat. No. 5,710,054 shows a method for diffusing shallow LDD regions from doped polysilicon spacers wherein the spacers are separated from the main polysilicon gate electrode by an oxide spacer which is thermally grown on the gate electrode. Not only is the oxide spacer difficult to form because it is trimmed by wet etching, but also the structure is subject to gate-to-source/drain shorts/leakage from the lower edge of the polysilicon gate to the polysilicon spacer. Further, if contacts are later formed by a salicide process, gate-to-source drain shorts are likely to occur by silicide bridging over the thin oxide from the upper edge of the gate electrode to the polysilicon sidewall. In another embodiment of the same reference an oxide sidewall spacer is formed, using conventional spacer formation methodology, alongside the gate electrode to control the lateral diffusion from the polysilicon sidewall source towards the channel region. This conventional spacer presents a high risk of silicide bridging during contact formation because of it's narrow upper section.

Son, U.S. Pat. No. 5,759,885 shows the formation of a CMOS structure wherein n-type LDD regions are formed for both the n-channel and p-channel devices by diffusing phosphorous from doped polysilicon spacers into the silicon substrate through an intermediate oxide layer. The p-type source/drain regions of the p-channel device are formed by out diffusion from a blanket BSG (borosilicate glass) layer. Like Wu, the method of Son has the disadvantages of diffusing LDD dopant through an intermediate oxide.

SUMMARY OF THE INVENTION

It is an object of this invention to provide a method for forming shallow LDD diffusions.

It is another object of this invention to provide a method for forming a CMOS having shallow p-type LDD elements on the p-channel device.

It is yet another object of this invention to provide a method for forming an ultra narrow diffusion source which is in direct contact with the subjacent silicon which is to be the diffusion recipient.

It is still another object of this invention to provide a method for forming an ultra narrow silicon diffusion source positioned alongside a polysilicon gate electrode and spaced therefrom by an essentially rectangular dielectric spacer.

It is still another object of this invention to provide a method for forming an ultra shallow, high concentration diffused element in a silicon substrate.

It is another object of this invention to provide a method for reducing source/drain series resistance of a polysilicon gate MOSFET.

It is another object of this invention to provide a method for reducing lateral encroachment of boron dopant under the gate of a p-channel MOSFET.

It is another object of this invention to provide a method for reducing short channel effects in a p-channel MOSFET.

It is yet another object of this invention to provide a method for reducing gate-to-source/drain shorts in MOSFETs formed by a salicide process.

It is still another object of this invention to provide a method for forming a source/drain contact which is made to both to the single crystalline silicon of the main source/drain region but also to the LDD region.

These objects are accomplished by forming essentially rectangular silicon nitride sidewalls alongside a polysilicon gate stack. The gate stack comprises a gate oxide, a polysilicon gate over the gate oxide and a silicon oxide top cap. The silicon nitride sidewall spacer is made essentially rectangular by a CMP (chemical mechanical planarization) and etching process.

Amorphous silicon sidewalls are then formed alongside the nitride sidewalls by conventional sidewall practices wherein a blanket silicon layer is deposited. The layer is then anisotropically etched leaving a silicon sidewall which is spaced laterally away from the polysilicon gate by the thickness of the nitride spacer. The silicon sidewalls, after implantation with dopant ions, serves as a diffusion source to form an LDD region in the subjacent active single crystalline silicon. A combination of furnace and rapid thermal annealing (RTA) is then used to drive the implanted dopant into the silicon surface and crystallizing and activating the silicon sidewall. Because the diffusion source is in direct contact with the active silicon, the LDD regions can be made shallow and the junctions abrupt. Such a junctions result in improved device performance and are relatively immune to short channel effects as compared to conventionally formed LDD junctions. In addition, there is less encroachment of the shallow LDD region under the gate electrode.

LDD junctions formed using the silicon source according to the teaching of this invention are shallower and permit higher drive currents than those formed using conventional BSG sources. While LDD diffusion from a BSG source results in much less tailing than conventional ion implantation, the tailing from the doped silicon source outlined in this invention is even less than that from the BSG source. This results in a more abrupt junction and still higher performance.

DESCRIPTION OF THE PREFERRED EMBODIMENTS

Figure 1A:
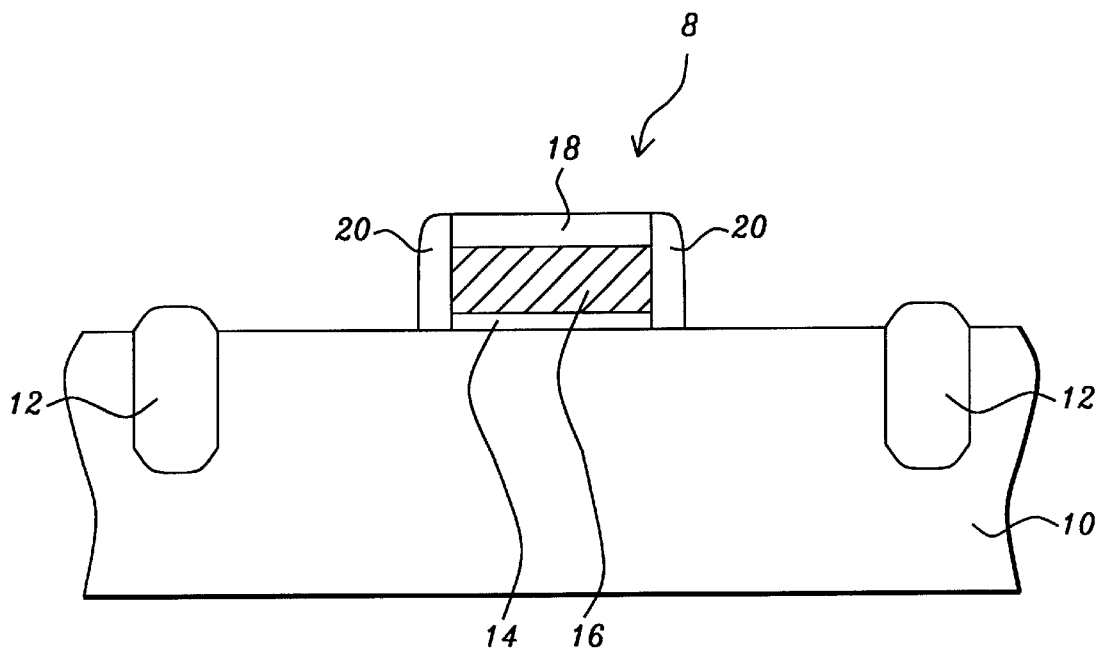
FIGS. 1A through 1F are cross sections showing the process steps for the formation of MOSFET according to a first embodiment of this invention.

In a preferred embodiment of this invention a p-type monocrystalline <100> oriented silicon wafer is provided. The first embodiment addresses the formation of a polysilicon gate MOSFET by a salicide process. Referring to FIG. 1A there is shown a cross section of an in-process, self-aligned polysilicon gate MOSFET on the silicon wafer 10 at a point in the process wherein a polysilicon gate stack 8 has been patterned by anisotropic dry etching. The dry etching may be either reactive ion etching (RIE) or plasma etching. Both methods are well known by those in the art and are widely used. The silicon wafer 10 has been provided with shallow trench field isolation (STI) 12 and a thin gate oxide 14 using conventional methods. Alternatively the field isolation may be formed by the well known LOCOS (local oxidation of silicon) method. The polysilicon gate stack 8 comprises a thin gate oxide 14, a polysilicon layer 16 and a silicon oxide cap 18. The stack layers 16 and 18 are blanket deposited onto a thermally grown gate oxide by a CVD method. Methods for forming a gate stack with an oxide cap are well known in the art. In the present embodiment, the gate oxide 14 is between about 1.5 and 2 nm. thick and the polysilicon layer 16 is between about 120 and 150 nm. thick. The polysilicon gate 16 may consist of a single uniformly doped polysilicon layer or it may have an upper heavily doped portion and a lower undoped portion. The oxide cap 18 is between about 10 and 20 nm. thick. Alternately the oxide cap 18 may be formed of a doped silicon oxide, for example, PSG (phosphosilicate glass), BSG (borosilicate glass), or BPSG (borophosphosilicate glass). A particular advantage of these doped silicate glasses, is that, because of their higher etch rate, they can be subsequently etched away with negligible loss of the isolation 12.

Rectangular or "squared" sidewalls 20 are next formed alongside the polysilicon gate stack 8. The sidewalls 20 are formed of silicon nitride by depositing a blanket silicon nitride layer over the wafer 10 and then selectively removing material. In conventional sidewall formation, the blanket nitride layer is anisotropically dry etched until the planar portions of the wafer are reached. Sidewalls formed by this conventional method are highly tapered and are not suitable to the present process. Instead the silicon nitride sidewalls are formed by the process described by Chen, et. al., in U.S. Pat. No. 6,358,827 B1, hereafter referred to as Chen, '827. Wherein "squared" or "nearly square" polysilicon spacers with essentially flat tops and parallel vertical sides are formed by anisotropic dry etching using a hardmask. Whereas Chen, '827 forms a squared off polysilicon spacer using an oxide hardmask patterned by CMP or RIE etchback, the vertical side of the silicon nitride spacer distal to the polysilicon gate of the present invention can be similarly formed by RIE using a self-alignment mask scheme to create an oxide hardmask over the silicon nitride. This requires a modification of the Chen, '827 procedure for forming the oxide RIE mask. A workable process for forming an oxide hardmask for forming a squared off or rectangular silicon nitride spacer for the current embodiments, using the method of Chen, '827, is illustrated in FIGS. 3A through 3F.

Figure 3A:
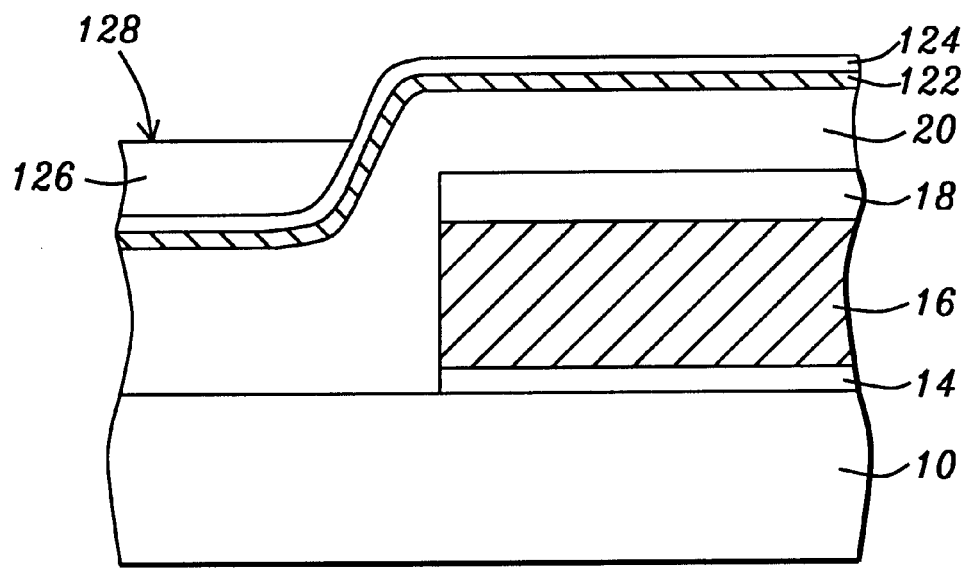
FIGS. 3A through 3F are cross sections showing the process steps for the formation of a squared-off silicon nitride sidewall spacer.
Figure 3B:
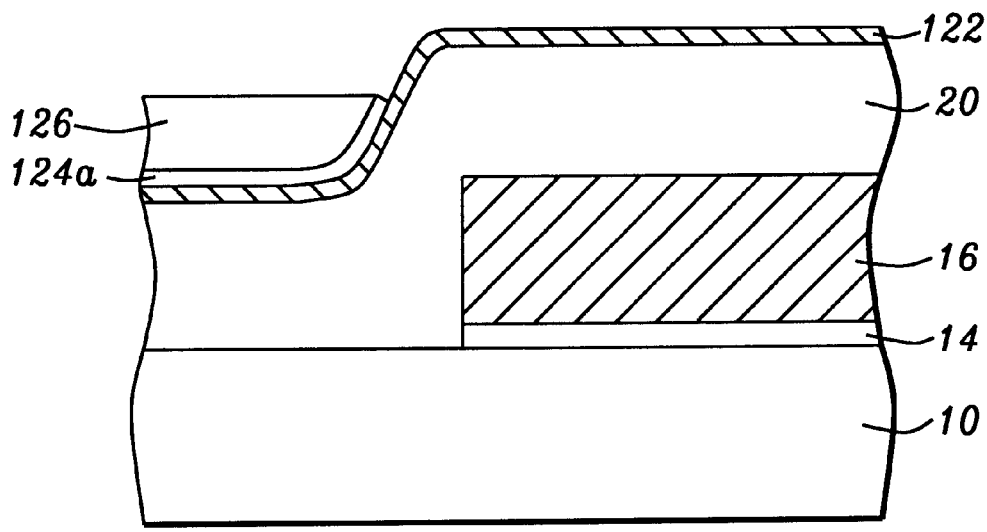
Figure 3C:
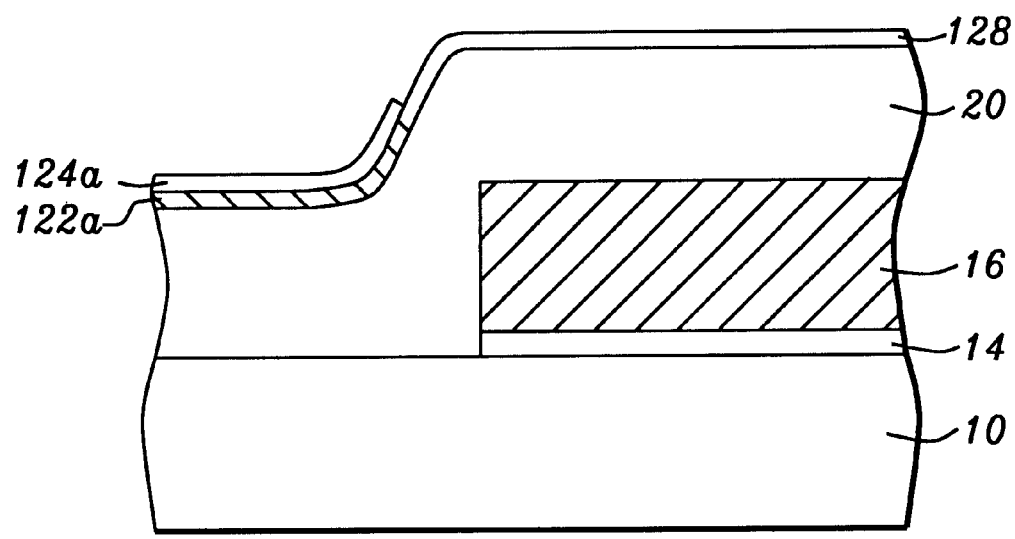
Figure 3D:
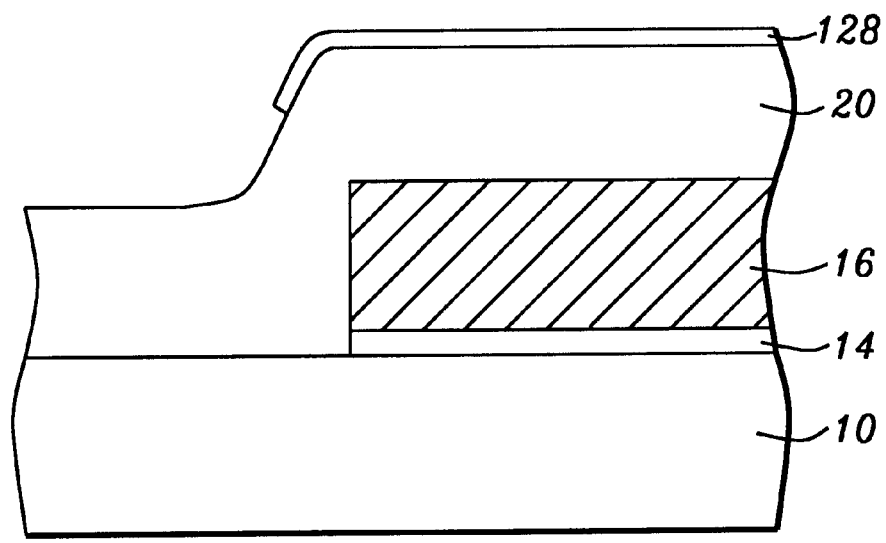
Figure 3E:
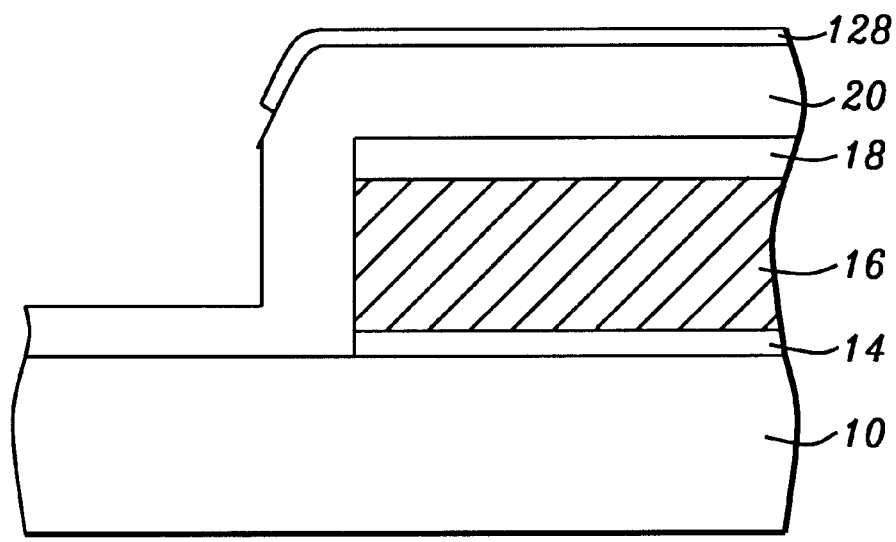
Figure 3F:
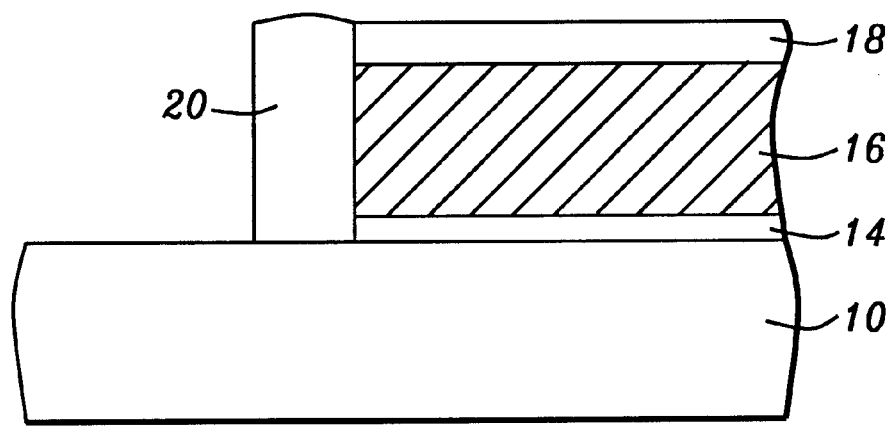

Referring to FIG. 3A, there is shown a cross section of one side of structure of FIG. 1A. The silicon nitride layer 20 is conformaly deposited over the wafer 10 according to the procedure of Chen, '827. Next a thin layer of polysilicon 22 is deposited over the nitride layer 20 followed by a second thin silicon nitride layer 124. An SOG (spin-on-glass) layer 126 is deposited to a level 128. Next, referring to FIG. 3B, the exposed silicon nitride layer 124 is removed by dip etching in hot phosphoric acid, exposing the underlying polysilicon layer 122 over the gate electrode 16. Referring to FIG. 3C, the SOG 126 is next removed and the exposed polysilicon layer 122 is oxidized to form an oxide layer 128 using the silicon nitride segment 124a as an oxidation mask. Finally, in FIG. 3D, the segments 124a and 124b are removed by dip etching in hot phosphoric acid and a selective silicon etch, for example amine/pyrocatechol, leaving the silicon oxide hardmask 128. Anisotropic etching of the silicon nitride layer then proceeds according to the two step process of Chen, '827 which includes the removal of the hardmask 128 (FIGS. 3E, 3F) to achieve the final squared off nitride spacer 20 shown in FIG. 3F and in the corresponding Figures of the first embodiment.

FIG. 1A shows the silicon nitride-sidewall spacers 20 having slight rounding on the upper corners away from the gate stack 8. This slight rounding illustrates what is meant by a "nearly square" spacer and is formed by a method of Chen, '827. The width of the silicon nitride spacers 20 is between about 10 and 20 nm.

Figure 1B:
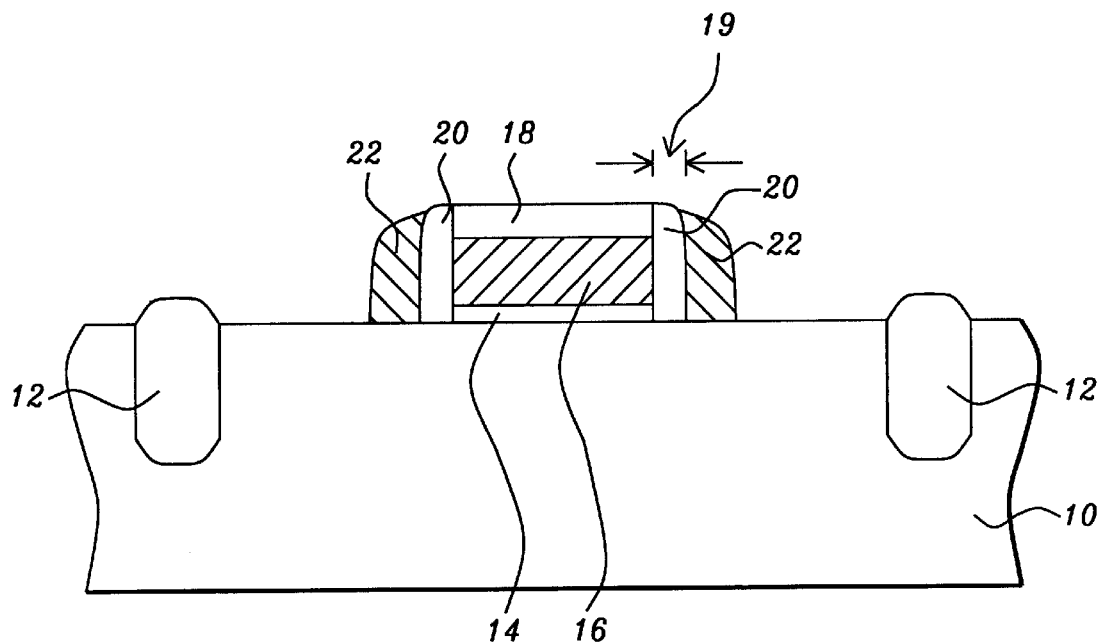

Referring now to FIG. 1B, silicon sidewalls 22 are formed by the conventional sidewall formation method whereby amorphous silicon is blanket deposited on the wafer 10 by LPCVD at a substrate temperature of between about 300 and 400° C. and then anisotropically blanket etched back to substrate silicon by RIE using a gas mixture containing $Cl_2$ or HBr. The significantly greater taper of the resulting silicon sidewalls 22 formed by the conventional method is illustrated in FIG. 1B. If the integrated circuit design contains only one type of device (NMOS or PMOS), the blanket silicon may optionally be in-situ doped with the corresponding impurity during deposition. For circuits containing both types of devices, for example CMOS integrated circuits, the appropriated impurities are ion implanted after the sidewalls are formed using appropriate masking. In the present embodiment, only a p-channel device is formed, and the boron impurity is ion implanted. Optionally the blanket silicon could have been in-situ boron doped also.

After the amorphous silicon sidewalls 22 have been formed the wafer 10 is subjected to a furnace anneal in a nitrogen ambient for a period of between about 30 and 40 minutes at a wafer temperature of between about 600 and 700° C. During this annealing period the amorphous silicon sidewalls 22 crystallize to form polycrystalline silicon.

The squared-off top of the nitride spacer 20 provides an increased surface path length between the silicon spacer and the polysilicon gate 16 without having to compromise contact area on the outer surface of the silicon spacer which contacts the LDD region. The additional surface path 19 over the top of the nitride spacer decreases the chance of gate-to-source/drain shorts cause by silicide bridging during the subsequent salicidation step. If the top were not squared-off the silicon spacer would have to be driven further down alongside the nitride spacer in order to achieve the same upper surface path over insulator. Shortening the spacer height in this way reduced the contact area on the outer surface of the silicon spacer.

Figure 1C:
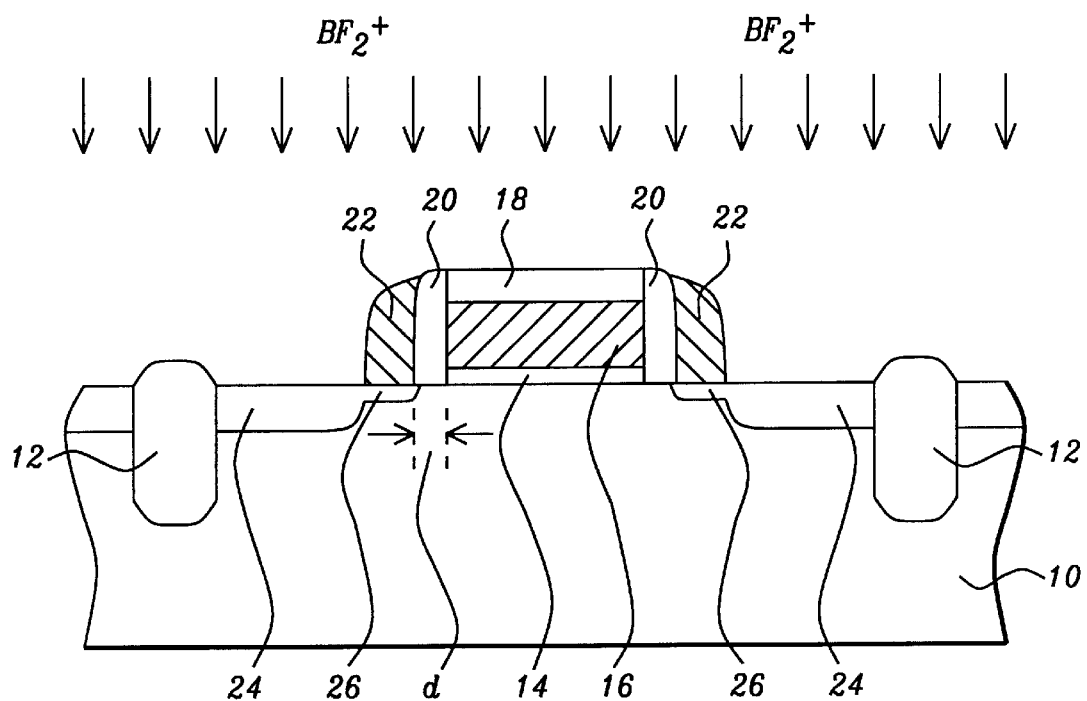

Referring now to FIG. 1C, $BF_2^+$ ions are implanted into the wafer 10 surface at a dose of between about $1 \times 10^{12}$ and $2 \times 10^{16}$ ions/cm² and at energies between about 12 and 18 keV. After the implantation, the wafer is subjected to an RTA in a nitrogen ambient at a wafer surface temperature of between about 1,000 and 1,100° C. for a period of between about 8 and 13 seconds. During this annealing period the boron implanted into the exposed active regions diffuses in the substrate wafer 10 to form source/drain regions 24 while boron from the boron doped polycrystalline silicon sidewalls 22 diffuses to into the subjacent single crystalline silicon to form shallow, high concentration LDD regions 26. It can be seen in FIG. 1C that the thickness of the silicon nitride spacer 20 determines the distance between the lateral edge of the LDD region and the effective channel region under the polysilicon gate. The presence of the nitride spacer 20 suppresses boron encroachment into the channel region under the gate 16. The silicon nitride spacers 20 have essentially vertical sides because their outer edges (distal to the polysilicon gate) are formed by anisotropic etching. The width of the spacer and consequently, the LDD-to-channel spacing "d" can be controlled to a high degree of precision.

Figure 1D:
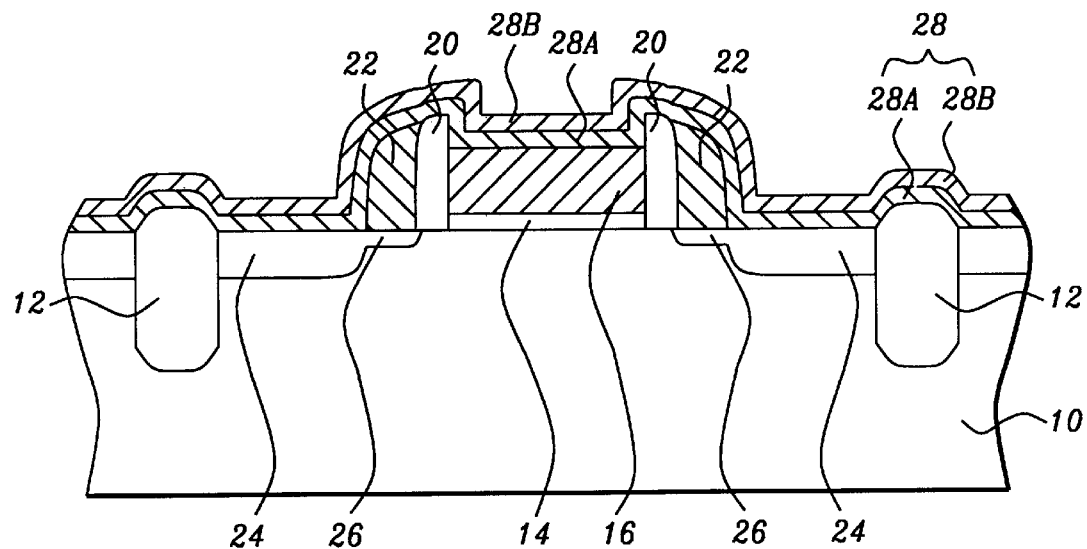

Referring now to FIG. 1D, the oxide cap 18 is etched away using a calibrated etchant, such as dilute HF, preferably 50:1, or, if the cap is formed of a silicate glass, a etchant containing $H_2O_2$ may be used.

A laminar Ti/TiN layer 28 having a thickness of between about 475 and 600 Angstroms is deposited over the wafer, preferably by sputtering. The Ti/TiN layer 28 is formed by first sputtering a titanium layer 28A having a thickness of between about 275 and 400 Angstroms or thereabout onto the wafer and immediately thereafter, without breaking vacuum, sputtering a TiN 28B layer having a thickness of 200 Angstroms or thereabout over the titanium layer. This may be accomplished by sputtering a titanium target, first with argon to form the Ti layer 28A, and then with nitrogen to form the TiN layer 28B. Alternately interchangeable targets of titanium and of titanium nitride may be used in the same chamber. Refractory metals other than titanium may also be used to form the metal layer 28A over the exposed silicon surfaces. Suitable metals include cobalt, molybdenum, and tungsten. Similarly the TiN layer 28B may be either omitted or substituted by an alternative protective layer.

Figure 1E:
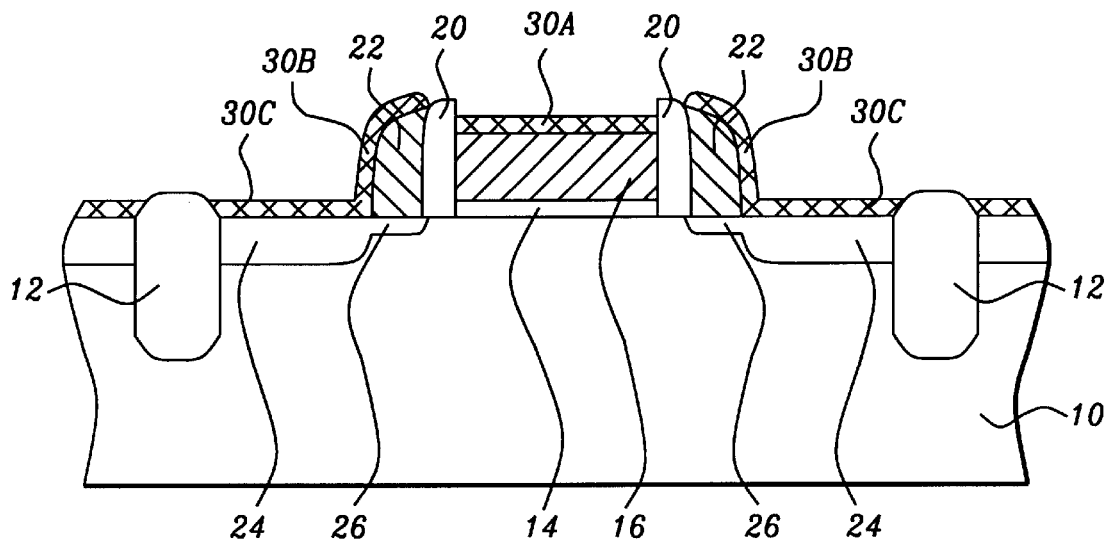

A first RTA is performed at a temperature of between about 675 and 750° C. or thereabout for a period of between about 10 and 40 seconds in a nitrogen ambient. During this period titanium silicide ($TiSi_2$) forms in the regions where the Ti/TiN layer 28 is deposited over silicon by reaction of the silicon with the Ti layer 28A. During the RTA step, nitrogen from the ambient, diffuses through the TiN layer 28B and reacts with the upper surface of the Ti layer 28A to form TiN, thereby consuming un-reacted Ti over the sidewalls 20 and over the field isolation 12. This inhibits the transport of silicon over the sidewall regions and thereby prevents bridging of the $TiSi_2$ layer between the gate electrode 16 and the polysilicon spacers 22, which, in turn connect to the source/drain regions 24 through the LDDs regions 26. Referring now to FIG. 1E The wafer is next subjected to an aqueous etching procedure wherein the TiN and residual titanium of the Ti/TiN layer 28 are selectively removed leaving the $TiSi_2$ 30A over the polysilicon gate 18, 30B on the polysilicon sidewalls 22, and 30C over the source/drain active areas 24. A suitable and commonly used aqueous etchant contains $H_2O_2$ and $NH_4OH$. A second RTA, performed at between about 800 and 950° C., for a period of between about 10 and 40 seconds, completes the formation of the $TiSi_2$ contacts.

Figure 1F:
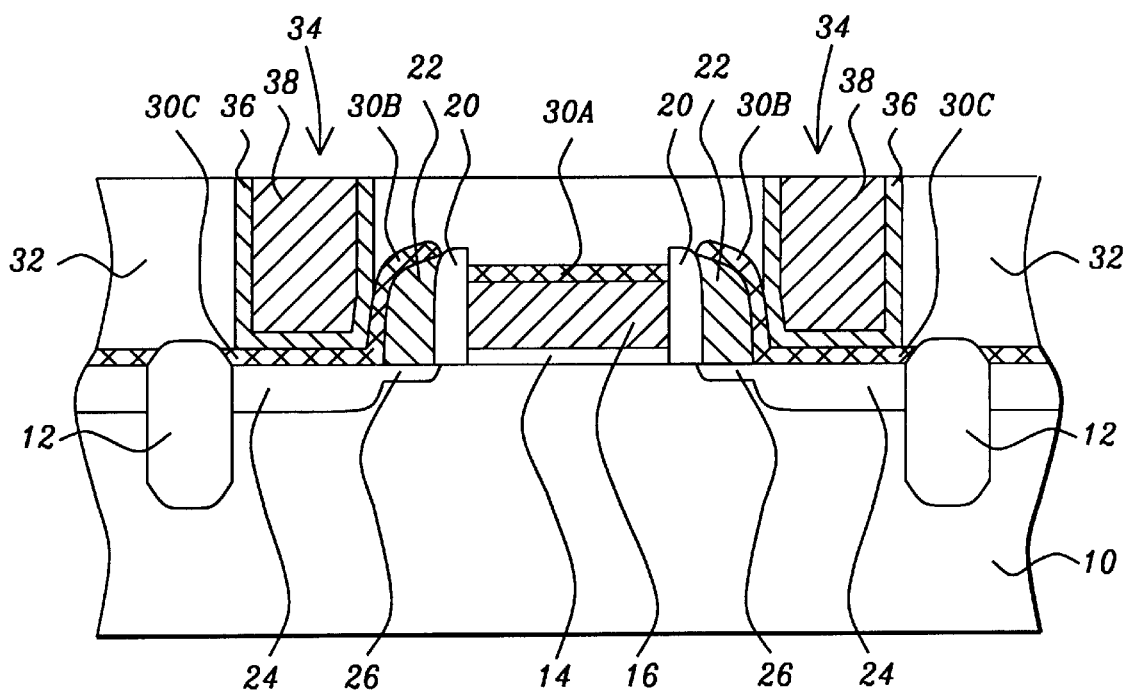

Processing of the MOSFET then proceeds by the deposition of an insulative layer 32 over the wafer (FIG. 1F). This layer 32, typically of a flowable glass such as borophosphosilicate glass, is thermally flowed to planarized the surface topology. Alternately, the layer 32 may be planarized by chemical mechanical planarization which is a well known planarization process. Contact openings 34 the source/drain regions 24 are then patterned and etched with RIE. A comparable contact opening (not shown) to the $TiSi_2$ layer 30A over the polysilicon gate electrode 16 is simultaneously formed elsewhere, preferably in a regions above or below the plane of the page where the gate electrode 16 passes over field oxide. Using well known procedures, a preferred barrier metallurgy 36, comprising Ti/TiN is formed over the wafer followed by the formation of tungsten plugs 38. In the figure, the tungsten barrier metallurgy 36 are shown overlapping the polysilicon sidewalls 22 to illustrate that the contact may extend in this manner to provide a maximum region of contact with the source/drain regions including the connection to the LDD portions 16. This additional region of contact results in a low source/drain series resistance with improved contact to the LDD regions 26 through the silicided sidewalls 22.

In a second embodiment, a complimentary n-channel/p-channel MOSFET pair are formed wherein the p-channel device has LDD regions formed by the method of this invention an the n-channel device does not. The device pair can comprise a CMOS pair.

Figure 2A:
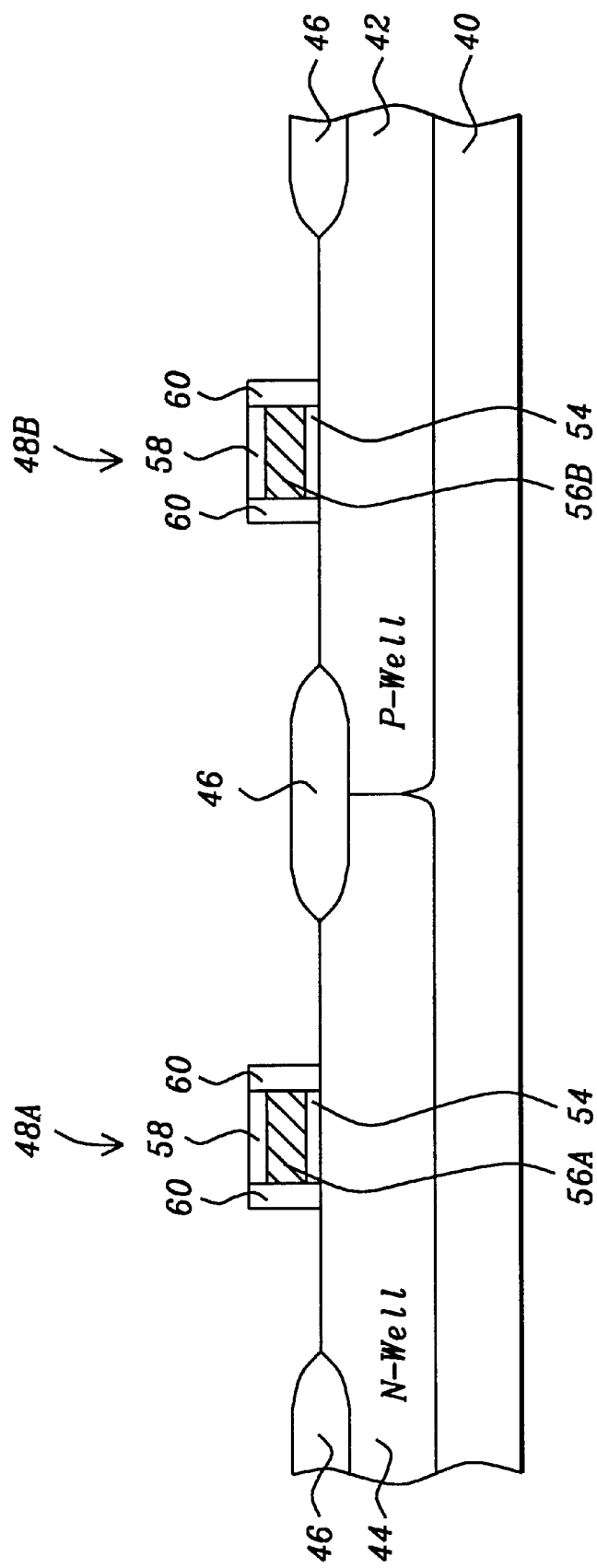
FIGS. 2A through 2H are cross sections showing the process steps for the formation of a complimentary MOSFET pair (CMOS) according to a second embodiment of this invention.

Referring to FIG. 2A, a silicon wafer 40 is provided. Using well known procedures,—and p-wells are formed in the wafer surface in regions where the CMOS device pair is to be formed. Field isolation 46 is formed to define an active silicon region for each device. LOCOS field oxide is illustrated in the diagram although the isolation may alternatively be STI. The n-channel device will be formed in the p-well 42 and the p-channel device in the n-well 44.

As in the first embodiment a polysilicon gate stack 48A and 48B is formed for each device in the respective well. The dry etching may be either reactive ion etching (RIE) or plasma etching. Both methods are well known by those in the art and are widely used. The silicon wafer 40 has been provided with polysilicon gate stacks 48A and 48B each of which comprise a thin gate oxide 54, a polysilicon gate electrode 56A and 56B respectively and a silicon oxide cap 58. The stack layers from which these stack components are formed are blanket deposited onto a thermally grown gate oxide by a conventional CVD method. Methods for forming a gate stack with an oxide cap are well known in the art. In the present embodiment, the gate oxide 54 is between about 1.5 and 2.0 nm. thick and the polysilicon layer from which the gate electrodes 56A and 56B are patterned is between about 120 and 150 nm. thick. The polysilicon gates 56A and 56B may consist of a single uniformly doped polysilicon layer or may have an upper heavily doped portion and a lower undoped portion. The oxide caps 58 are between about 10 and 20 nm. thick. Alternately the oxide caps 58 may be formed of a doped silicon oxide or silicate glass, for example, PSG (phosphosilicate glass), BSG (borosilicate glass), or BPSG (borophosphosilicate glass). A particular advantage of these doped silicate glasses, is that, because of their higher etch rate, they can be subsequently etched away with negligible loss of the field isolation 46.

Rectangular or "squared" sidewall spacers 60 are next formed alongside the polysilicon gate stacks 48A. The sidewall spacers 60 are formed of silicon nitride by depositing a blanket silicon nitride layer over the wafer 40 and then selectively removing portions of the layer. In conventional sidewall formation, the blanket nitride layer is anisotropically dry etched until the planar silicon surface of the wafer is reached. Sidewalls formed by this conventional method are highly tapered and are not suitable to the present process. Instead, as in the first embodiment, the silicon nitride sidewall spacers 60 in this embodiment are formed by the process described by Chen, '827 as detailed in the first embodiment and illustrated by FIGS. 3A through 3F. The width of the silicon nitride spacers 60 is between about 15 and 20 nm.

Figure 2B:
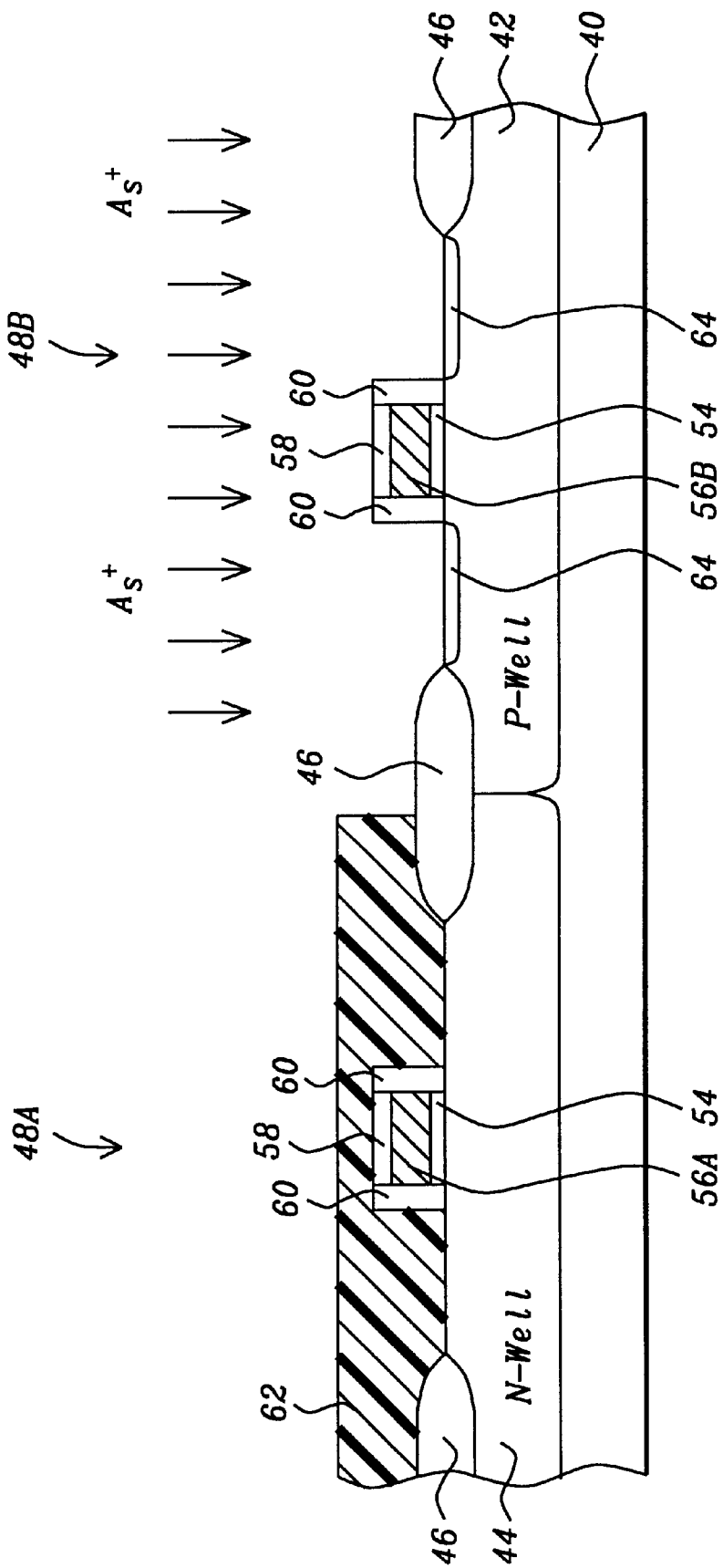
Figure 2C:
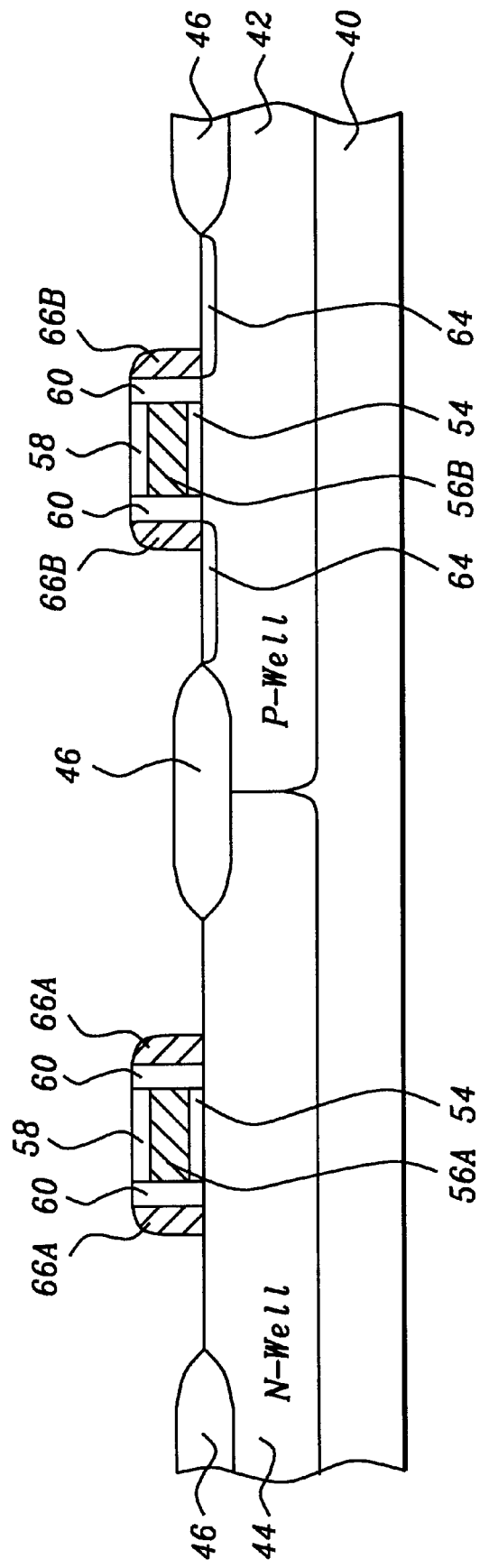

Referring next to FIG. 2B, photoresist 62 is patterned to form a block-out mask covering the region of where the p-channel device is being formed. The wafer 40 is then ion implanted with arsenic ions at a dose of between about $3\times10^{13}$ and $4\times10^{13}$ ions/$cm^2$ and an energy of between about 12 and 16 keV forming n-type LDD regions 64 for the n-channel device. Referring next to FIG. 2C, the photoresist mask 62 is stripped, either by plasma ashing or with a liquid stripper, and amorphous silicon sidewalls 66A and 66B are formed alongside both the gate stacks 48A and 48B using the conventional sidewall formation method whereby amorphous silicon is blanket deposited on the wafer 40 by LPCVD, and then anisotropically blanket etched back to substrate silicon by RIE using a gas mixture containing a halogen species.

After the amorphous silicon sidewalls 66A and 66B have been formed the wafer 40 is subjected to a furnace anneal in a nitrogen ambient for a period of between about 30 and 40 minutes at a wafer temperature of between about 600 and 700° C. During this annealing period the amorphous silicon sidewalls 66A and 66B crystallize to form polycrystalline silicon.

The squared-off tops of the nitride spacers 60 provide an increased surface path length between the silicon spacer and the polysilicon gates 56A and 56B without having to compromise contact area on the outer surface of the silicon spacer which contacts the LDD region. The additional surface path over the top of the nitride spacer decreases the chance of gate-to-source/drain shorts cause by silicide bridging during the subsequent salicidation step. If the top were not squared-off the silicon spacer would have to be driven further down alongside the nitride spacer in order to achieve the same upper surface path over insulator. Shortening the spacer height in this way reduced the contact area on the outer surface of the silicon spacer.

Figure 2D:
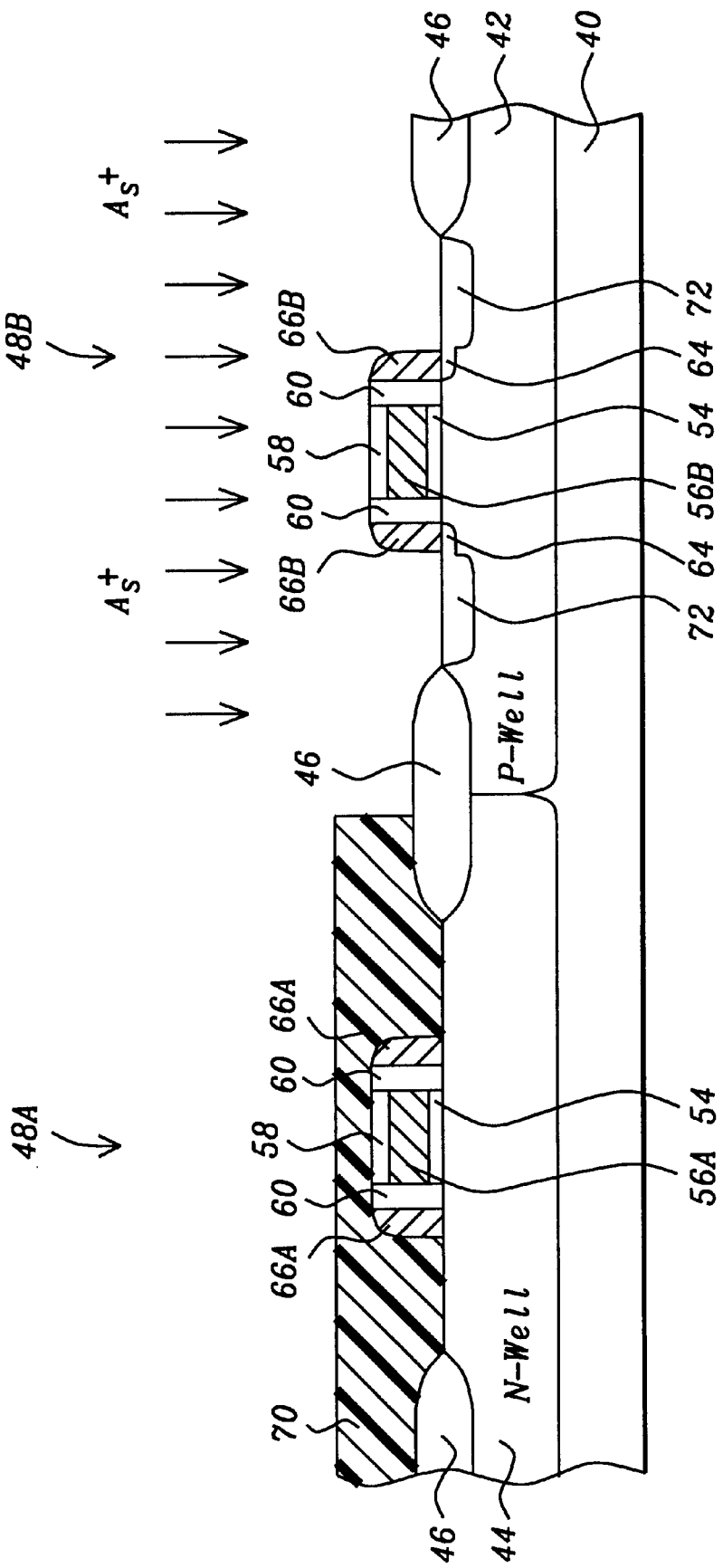

Referring next to FIG. 2D, a second photoresist block-out mask 70 is patterned over the region of the gate stack 48A where the p-channel device is to be formed and the source/drain regions 72 of that device are ion implanted with arsenic at a dose of between about $3\times10^{13}$ and $4\times10^{13}$ ions/$cm^2$ and an energy of between about 12 and 16 keV forming n-type LDD regions 64 for the n-channel device.

Figure 2E:
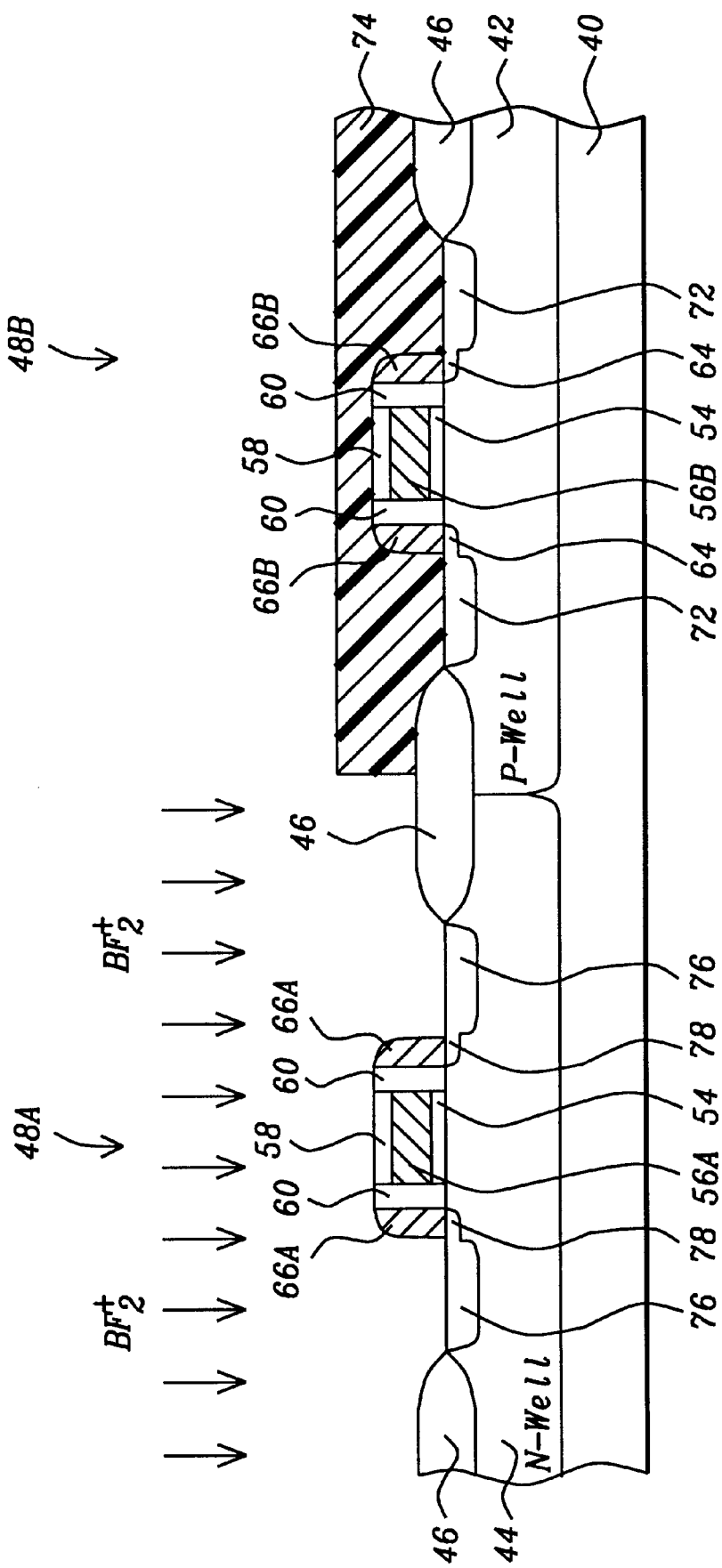

Referring next to FIG. 2E, the photoresist mask 70 is stripped, either by plasma ashing or with a liquid stripper, and a third photoresist block-out mask 74 is patterned to cover the region of where the n-channel device is to be formed. $BF_2^+$ ions are then implanted into the region of the p-channel device under the polysilicon gate 48A at a dose of between about $1\times10^{16}$ and $2\times10^{16}$ ions/$cm^2$ and at energies between about 12 and 18 keV. After the implantation, the wafer is subjected to an RTA in a nitrogen ambient at a wafer surface temperature of between about 1,000 and 1,100° C. for a period of between about 8 and 13 seconds. During this annealing the boron implanted into the exposed active regions diffuses into the substrate wafer 40 to form source/drain regions 76 while boron from the polysilicon sidewalls 66A diffuses to into the subjacent single crystalline silicon to form shallow, high concentration LDD regions 78. It can be seen in FIG. 2E that the thickness of the silicon nitride spacers 60 determines the distance between the lateral edge of the LDD regions and the effective channel regions under the respective polysilicon gates. The presence of the nitride spacer 60 in the p-channel device suppresses boron encroachment into the channel region under the gate 56A. The silicon nitride spacers 60 have essentially vertical sides because their outer edges (distal to the polysilicon gate) are formed by the anisotropic etching process of Chen, '827 as set forth in the first embodiment. The width of the spacers and consequently, the LDD-to-channel spacing can be controlled to a high degree of precision.

Figure 2F:
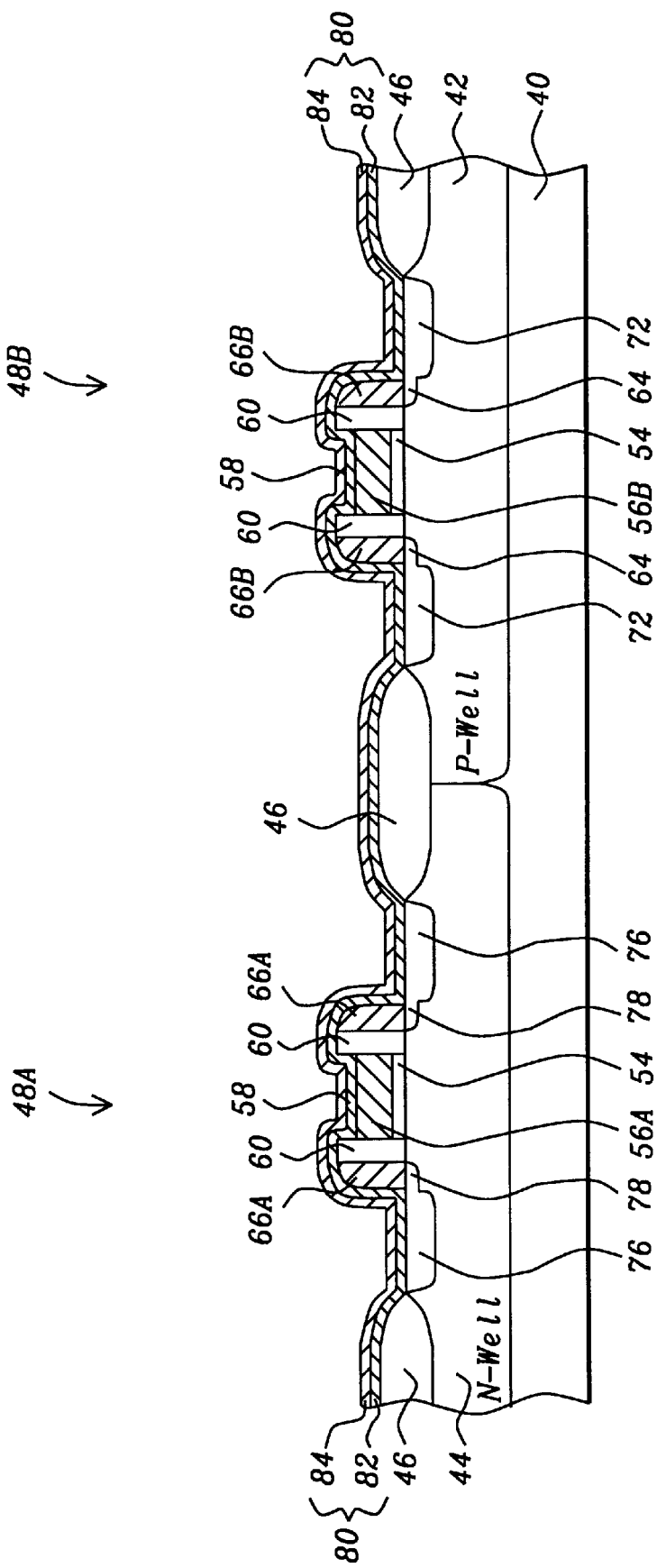

Referring now to FIG. 2F, the photoresist mask 74 is stripped, either by plasma ashing or with a liquid stripper, and the oxide caps 58 are etched away using a calibrated etchant, such as dilute HF, or if the caps are formed of a doped oxide or silicate glass, a etchant containing $H_2O_2$ may be used.

A laminar Ti/TiN layer 80 having a thickness of between about 475 and 600 Angstroms is deposited over the wafer, preferably by sputtering. The Ti/TiN layer 80 is formed by first sputtering a titanium layer 82 having a thickness of between about 275 and 400 Angstroms or thereabout onto the wafer and immediately thereafter, without breaking vacuum, sputtering a TiN 84 layer having a thickness of 200 Angstroms or thereabout over the titanium layer. This may be accomplished by sputtering a titanium target, first with argon to form the Ti layer 82, and then with nitrogen to form the TiN layer 84. Alternately interchangeable targets of titanium and of titanium nitride may be used in the same chamber. Refractory metals other than titanium may also be used to form the layer 82 over the exposed silicon surfaces. Suitable metals include cobalt, molybdenum, and tungsten. Similarly the TiN layer 84 may be either omitted or substituted by an alternative protective layer.

Figure 2G:
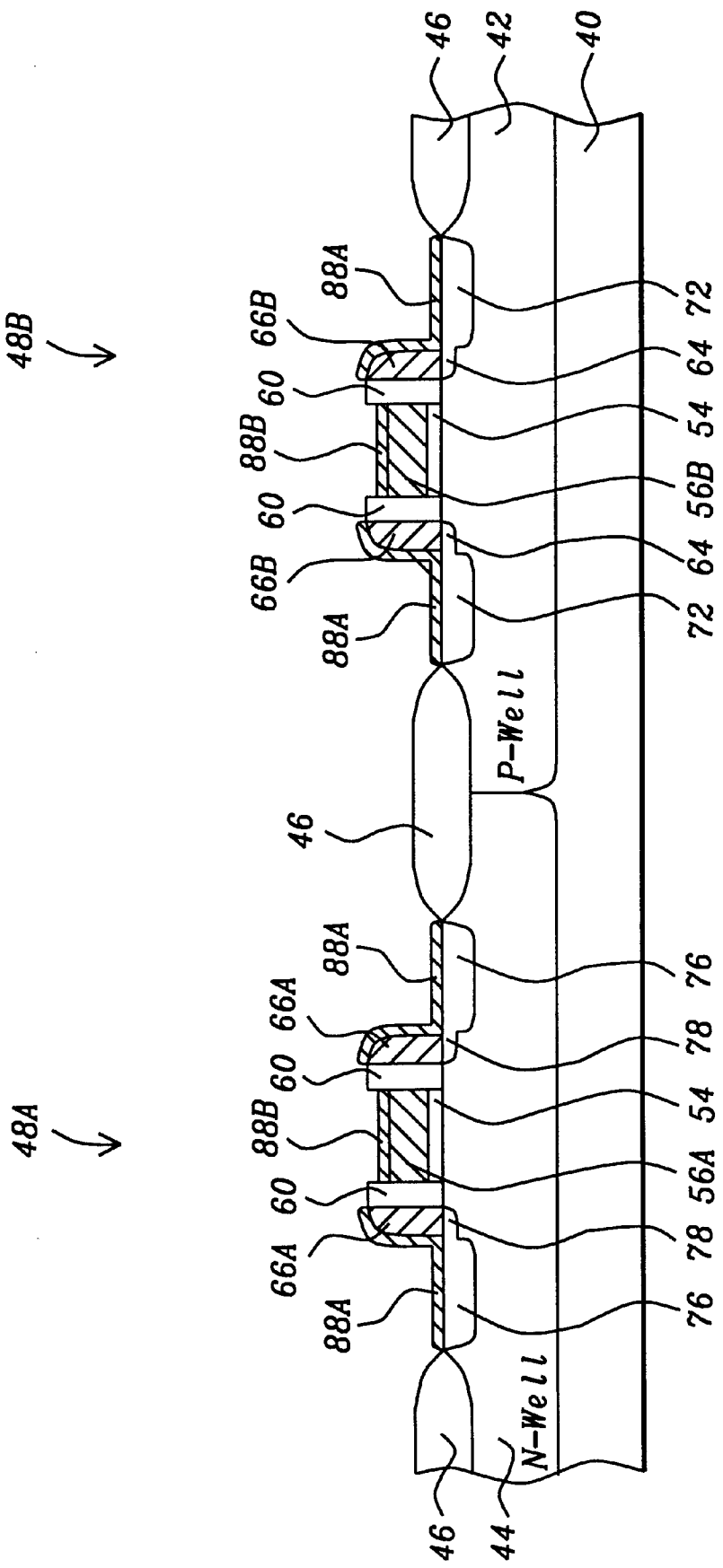
Figure 2H:
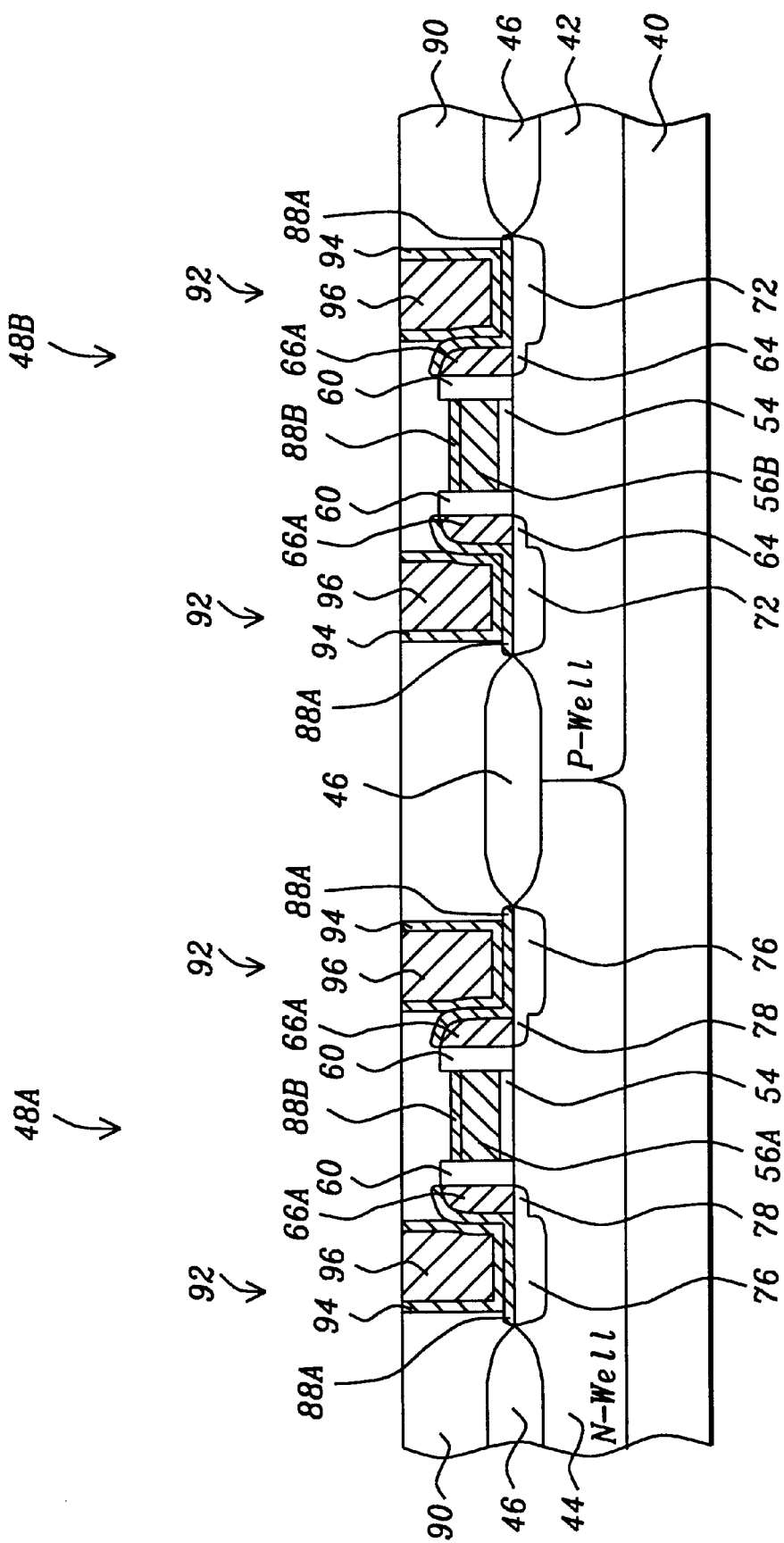

A first silicide RTA is performed at a temperature of between about 675 and 750° C. or thereabout for a period of between about 10 and 40 seconds in a nitrogen ambient. During this period titanium silicide ($TiSi_2$) forms in the regions where the Ti/TiN layer 80 is deposited over silicon by reaction of the silicon with the Ti layer 82. During the RTA step, nitrogen from the ambient, diffuses through the TiN layer 84 and reacts with the upper surface of the Ti layer 82 to form TiN, thereby consuming un-reacted Ti over the sidewalls 60 and over the field isolation 46. This inhibits the transport of silicon over the sidewall regions and thereby prevents bridging of the $TiSi_2$ layer between the gate electrodes 56A and 56B and the corresponding polysilicon spacers 60A and 60B respectively. Referring now to FIG. 2G The wafer 40 is next subjected to an aqueous etching procedure wherein the TiN and any residual titanium of the Ti/TiN layer 80 are selectively removed leaving the $TiSi_2$ 86 over the polysilicon gates 56A and 56B on the polysilicon sidewalls 66A and 66B, and over the source/drain active areas 72 and 76, leaving behind the $TiSi_2$ contacts 88A over the source/drain regions of each device and 88B over the polysilicon gates. A suitable and commonly used aqueous etchant contains $H_2O_2$ and $NH_4OH$. A second RTA, performed at between about 800 and 950° C., for a period of between about 10 and 40 seconds, completes the formation of the $TiSi_2$ contacts.

Processing of the MOSFET pair then proceeds by the deposition of an insulative layer 90 over the wafer (FIG. 1H). This layer 90, typically of a flowable glass such as borophosphosilicate glass, is thermally flowed to planarized the surface topology. Alternately, the layer 90 may be planarized by chemical mechanical planarization which is a well known planarization process. Contact openings 92 the source/drain regions 72 and 76 are then patterned and etched with RIE. Comparable contact openings (not shown) to the $TiSi_2$ layers 88B over the polysilicon gate electrodes 56A and 56B are simultaneously formed elsewhere, preferably in regions above or below the plane of the page where the gate electrodes 56A and 56B pass over field oxide. Using well known procedures, a preferred barrier metallurgy 94, comprising Ti/TiN is formed in the contact openings followed by the formation of tungsten plugs 96. In the figure, the tungsten plugs 96 and the barrier metallurgy 94 are shown overlapping the polysilicon sidewalls 66A and 66B to illustrate that the contacts may extend in this manner to provide a maximum region of contact with the source/drain regions including the LDD regions 64 and 78. This additional region of contact results in a low source/drain series resistance with improved contact to the LDD regions 64 and 78 through the silicided polysilicon sidewalls 66A and 66B.

While this invention has been particularly shown and described with reference to the preferred embodiments thereof, it will be understood by those skilled in the art that various changes in form and details may be made without departing from the spirit and scope of the invention. While the embodiments of this invention are directed towards the formation of integrated circuit elements in a silicon based technology, the principles and procedures practiced therein are understood to be applicable to technologies using other semiconductor materials.

What is claimed is:

1. A method for forming a MOSFET having shallow, high concentration LDD regions and low source/drain series resistance comprising:
    (a) providing a semiconductor substrate having an active region enclosed by field isolation;
    (b) forming a gate electrode stack over said active region;
    (c) forming rectangular spacers along each side of said gate stack;
    (d) forming amorphous silicon sidewalls alongside each of said rectangular spacers;
    (e) implanting dopant ions into exposed portions of said active region and into said amorphous silicon sidewalls;
    (f) performing a first annealing of said substrate thereby simultaneously diffusing said implanted ions from said amorphous silicon sidewalls into said substrate forming lightly doped drain regions, crystallizing said amorphous silicon sidewalls thereby forming polysilicon sidewalls, and diffusing said implanted ions into said active region thereby forming source/drain regions;
    (g) depositing a refractory metal layer on said substrate;
    (h) depositing a refractory metal nitride layer on said refractive metal layer;
    (i) performing a second annealing of said wafer thereby forming a metal silicide on said exposed active regions and on said polysilicon sidewalls; and
    (j) removing residual said refractory metal and said refractory metal nitride.

2. The method of claim 1 wherein said gate electrode stack comprises a gate oxide, a polysilicon gate electrode on said gate oxide, and an insulative cap on said gate electrode.

3. The method of claim 2 wherein said insulative cap is silicon oxide, a borosilicate glass, a phosphosilicate glass, or a borophosphosilicate glass.

4. The method of claim 3 wherein said insulative cap is between about 10 and 20 nm. thick.

5. The method of claim 1 wherein said rectangular spacers are formed of silicon nitride and are between about 10 and 20 nm. wide.

6. The method of claim 1 wherein said semiconductor substrate is silicon.

7. The method of claim 6 wherein said active regions are n-type and said ions are $BF_2^+$ ions.

8. The method of claim 6 wherein said first annealing is accomplished in a furnace at a temperature of between about 600 and 700° C. in a nitrogen ambient for a period of between about 30 and 40 minutes.

9. The method of claim 6 wherein said second annealing is accomplished by rapid thermal annealing at a surface temperature of between about 1,000 and 1,100° C. in a nitrogen ambient for a period of between about 8 and 13 seconds.

10. The method of claim 1 wherein said refractory metal is titanium, tantalum, or molybdenum.

11. The method of claim 1 wherein said refractory metal nitride is titanium nitride, tantalum nitride, or molybdenum nitride.

12. A method for forming a CMOS structure having a p-channel device with shallow, high concentration LDD regions and low source/drain series resistance comprising:

(a) providing a silicon wafer substrate having a p-type active region enclosed by a first field isolation and an n-type active region enclosed by a second field isolation;

(b) forming a first polysilicon gate stack comprising a first gate oxide, a first polysilicon gate electrode, and a first insulative cap on said p-type active region and second polysilicon gate stack comprising a second gate oxide, a second polysilicon gate electrode, and a second insulative cap on said n-type active region;

(c) forming first rectangular spacers along each side of said first polysilicon-gate stack and second rectangular spacers along each side of said second polysilicon gate stack;

(d) implanting n-type dopant ions into exposed portions of said p-type active region while protecting said n-type active region with a first block-out mask thereby forming lightly dope drain regions of said n-channel device;

(e) removing said first block-out mask;

(f) forming amorphous silicon sidewalls alongside each of said rectangular spacers;

(g) implanting n-type dopant ions into exposed portions of said p-type active region while protecting said n-type active region with a second block-out mask thereby forming source/drain regions of said n-channel device;

(h) removing said second block-out mask;

(i) implanting p-type dopant ions into exposed portions of said n-type active region and into the amorphous silicon sidewalls alongside said second spacers while protecting said p-type active region with a third block-out mask;

(j) removing said third block-out mask;

(k) performing a first annealing of said wafer thereby simultaneously diffusing said implanted p-type dopant ions from said amorphous silicon sidewalls alongside said second spacers into said silicon wafer forming lightly doped drain regions of said p-channel device, crystallizing said amorphous silicon sidewalls thereby forming polysilicon sidewalls, and diffusing said implanted ions into said active region forming source/drain regions;

(l) removing said first insulative cap and said second insulative cap;

(m) depositing a refractory metal layer on said wafer;

(n) depositing a refractory metal nitride layer on said refractive metal layer;

(o) performing a second annealing of said wafer thereby forming a metal silicide on said exposed active regions, on said first and said second polysilicon gates and on said polysilicon sidewalls;

(p) removing residual said refractory metal and said refractory metal nitride leaving silicide contact regions on said source/drain regions and said polysilicon sidewalls;

(q) depositing an insulative layer over said wafer;

(r) patterning and etching said insulative layer to form contact openings to said silicide contact regions and to said first and said second polysilicon gates; and (s) forming conductive contacts in said contact openings.

13. The method of claim 12 wherein said first and said second insulative caps are formed of a borosilicate glass, a phosphosilicate glass, or a borophosphosilicate glass.

14. The method of claim 12 wherein said first and said second insulative caps are between about 10 and 20 nm. thick.

15. The method of claim 12 wherein said first and said second rectangular spacers are formed of silicon nitride and are between about 10 and 20 nm. wide.

16. The method of claim 12 wherein said active regions are n-type and said ions are $BF_2^+$ ions.

17. The method of claim 12 wherein said first annealing is accomplished in a furnace at a temperature of between about 600 and 700° C. in a nitrogen ambient for a period of between about 30 and 40 minutes.

18. The method of claim 12 wherein said second annealing is accomplished by rapid thermal annealing at a surface temperature of between about 1,000 and 1,100° C. in a nitrogen ambient for a period of between about 8 and 13 seconds.

19. The method of claim 12 wherein said refractory metal is titanium, tantalum, or molybdenum.

20. The method of claim 12 wherein said refractory metal nitride is titanium nitride, tantalum nitride, or molybdenum nitride.

* * * * *